United States Patent
Ozono

(10) Patent No.: US 6,645,585 B2
(45) Date of Patent: *Nov. 11, 2003

(54) CONTAINER FOR TREATING WITH CORROSIVE-GAS AND PLASMA AND METHOD FOR MANUFACTURING THE SAME

(75) Inventor: Shunichi Ozono, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/870,282

(22) Filed: May 29, 2001

(65) Prior Publication Data

US 2002/0009560 A1 Jan. 24, 2002

(30) Foreign Application Priority Data

May 30, 2000 (JP) .................................. P 2000-160569

(51) Int. Cl.$^7$ .......................... B32B 1/00; B32B 17/06; H01L 21/306; C23C 14/00; C04B 35/48; C04B 35/40; C04B 35/505

(52) U.S. Cl. ............... 428/34.4; 428/34.6; 428/426; 428/432; 428/141; 156/345.3; 156/914; 156/916; 204/298.3; 501/105; 501/127; 501/152; 501/153

(58) Field of Search .................. 428/34.6, 426, 428/432, 34.4, 141; 156/916, 914, 345.3; 204/298.3; 581/152, 127, 105, 153

(56) References Cited

U.S. PATENT DOCUMENTS

| | | | | |
|---|---|---|---|---|
| 4,861,737 A | * | 8/1989 | Prud'Homme van Reine et al. | 501/152 |
| 5,216,067 A | * | 6/1993 | Yamada et al. | 524/520 |
| 5,981,415 A | * | 11/1999 | Waku et al. | 501/80 |
| 6,060,158 A | * | 5/2000 | Ono et al. | 428/339 |
| 6,123,791 A | * | 9/2000 | Han et al. | 156/1 |
| 6,152,071 A | * | 11/2000 | Akiyama et al. | 118/723 VE |
| 6,383,964 B1 | * | 5/2002 | Nakahara et al. | 501/152 |

FOREIGN PATENT DOCUMENTS

| | | | | |
|---|---|---|---|---|
| EP | 992518 A1 | * | 4/2000 | C08F/214/26 |
| JP | 05-217946 | | 8/1993 | |
| JP | 11-283972 | | 10/1999 | |
| JP | 11283972 A | * | 10/1999 | H01L/21/3065 |

* cited by examiner

Primary Examiner—William P. Watkins, III
Assistant Examiner—Chris Bruenjes
(74) Attorney, Agent, or Firm—Hogan&Hartson

(57) ABSTRACT

There is provided a treatment container which enables to prolong a period of time taken for reaction products, such as a halide generated through reaction with corrosive halide gas, to exfoliate and fall down as particles, and decreases the frequency of periodic maintenance operation, thereby implementing increase of operating time. The treatment container constituting a chamber or a bell jar has a portion of the inner surface to be exposed to corrosive halide gas plasma and is formed with a sintered body mainly composed of a compound of yttrium and aluminum with oxygen, and the portion has a roughened surface of a mean roughness Ra of 1.5 to 10 $\mu$m.

10 Claims, 3 Drawing Sheets

CONTAINER FOR TREATING WITH CORROSIVE-GAS AND PLASMA AND METHOD FOR MANUFACTURING THE SAME

BACKGROUND OF THE INVENTION

1. Field of the Invention

The present invention relates to a treatment container for corrosive-gas plasma etching or depositing such as chambers and bell jars for use in depositing apparatuses and etching apparatuses, and to a method for manufacturing such a treatment container.

2. Prior Art

Conventionally, there have been used, in the process of manufacturing semiconductor devices, a depositing apparatus for creating thin films on a semiconductor wafer through transformation of a reactant gas to plasma, and an etching apparatus for performing fine processing. Plasmic reactant gas has an advantage of enabling the wafer to be deposited or etched at relatively low temperature, without higher temperature required to the wafer.

FIG. 6 epitomizes a prior art treatment apparatus, i.e. a treatment container 1, having the shape of a hanging bell called a bell jar. In an etching apparatus, a workpiece W is placed on a stage 6 inside the treatment container 1 of silica glass into which a reactant gas and a corrosive halide gas are introduced. In the step of transforming the reactant gas to plasma, the workpiece W is etched to partially remove or smooth its surface (see Japanese Patent Laid-Open Publication No. 5-217946).

In the case of a depositing apparatus, a treating container takes the form of a chamber with ceramic fragments lined to the inside surface thereof. A semiconductor wafer to be treated is placed inside the chamber in which a material gas and a corrosive halide gas are introduced, and then through transformation of the reactant gas to plasma, a thin film is layered on the surface of the workpiece.

As shown in FIG. 6, a top portion of the treatment container 1 is integrally connected to an extended introduction tube 14 for introducing gas, and an induction coil 5 arranged outside the introduction tube 14. Inside the treatment container 1, there is provided a support member 6, or a stage, for supporting a workpiece W thereon. The induction coil 5 generates a high frequency electromagnetic field inside the introduction tube to convert a reactant gas supplied into the introduction tube 14 to plasma. The plasma is led to the inside of the treatment container 1 to involve in reaction on the surface of the workpiece.

As described above, the treatment container 1 uses ceramics or silica glass in the portion that is exposed to corrosive halide gas and/or plasma. The surface of the portion has been previously smoothened to avoid corroding the surface by plasma.

Such a reactant gas for the above treatment, however, is corrosive halide gas including fluorine or chlorine containing gases. The gas, if used alone as a gas or transformed to plasma, reacts with ceramics or silica glass constituting an inner surface 102 of the treatment container 1, creating and depositing halide compounds on the inner surface 102. When evaporated or broken by plasma, halide particles fall down from the surface and adhere onto the workpiece W. Such particles may adversely affect performance of electronic parts produced from the workpiece W.

Japanese Patent Laid-Open Publication No. 11-283972 discloses a treatment container in which numerous asperities are formed on the surface of the portion exposed to corrosive gas and/or plasma which is composed of a ceramic or silica glass to avoid contaminating the workpiece. However, the above proposed technique failed to accomplish efficient corrosive resistance of the container.

Halides created on the surface of the container often react with oxygen contained in a mixed gas which is introduced into the treatment container 1 to form oxide or oxynitride, which is apt to be attached to a lower temperature area in the surface of the treatment container 1. After being deposited in some quantity, the oxide or oxynitride is exfoliated from the container surface in the form of particles which are attached onto the surface of the workpiece W to be treated, such as a semiconductor wafer. As a result, such attached materials as a halide exerts negative influence on the performance of the workpiece W. Therefore, it is important to suspend the use of the apparatus and clean away halide composite from the inner surface 102 of the container 1.

There has been also a problem that ceramics excellent in corrosion resistance, which are not always sufficient in strength, cause breakage or cracks of the treatment container 1 while being handled.

SUMMARY OF THE INVENTION

An object of the present invention is to provide a treatment container capable of preventing halide and other reaction products from depositing on a workpiece during treating with corrosive gas plasma inside the treatment container, allowing the container to be used for long-term processing.

Another object of the present invention is to provide a treatment container with strength sufficient enough to prevent defects from generating while handling it for treating with corrosive gas plasma.

According to the present invention, the treatment container includes a portion of the treatment container which is exposed to corrosive halide gas and/or plasma is formed with a sintered body mainly including yttria and alumina, and is provided with a roughened surface having a mean roughness Ra of 1.5 to 10 µm, according to the definitions of JIS B0601, on the inner surface thereof.

In the present invention, even though reaction products such as a halide are generated on said roughened surface in the treatment container due to reaction of a corrosive gas, particularly, halogen-containing gas, to the sintered material constituting the container, the roughened surface portion can prevent the reaction products from exfoliating as particles from the surface, prolong a period of time till the particles fall down, and therefore decrease contamination to the workpiece. This can decrease the frequency of periodic cleaning operations of the container, providing long operating period of time required for the depositing or etching apparatus.

Further, the present invention may include a method of manufacturing the treatment container which has a portion to be exposed to corrosive halide gas and/or plasma, wherein the portion is roughened to a mean roughness Ra of 1.5 to 10 µm by blasting the inner surface, of the sintered body, of the container, thereby effectively roughening the portion of the inner surface.

In the present invention, there is another method for manufacturing a treatment container in which in molding a molded body using a rubber press from a material powder, a roughened surface configuration is preparatorily formed on the outer surface of a core for pressing the inner surface of the container, and, in the rubber-pressing step, the configuration on the core is transferred to the inner surface of the molded body, and thereafter the firing of the molded body is performed to form a sintered body having the inner surface roughened with the predetermined configuration.

In addition, the treatment container of the present invention may contain a resin film applied to the outer surface thereof. The resin film can reinforce a wall portion susceptible to generation of cracks by buffering mechanical impact, thereby enabling considerable decrease in breakage or cracks of the treatment container during being handled. A desirable resin film covering the surface of a ceramics can also provide the container with a high resistance to strongly corrosive chemical components used for removing and cleaning contaminants which has formed on the inner surface of the treatment container for long time use.

BRIEF DESCRIPTION OF THE DRAWINGS

Following drawings are provided for detailed description of embodiments of the present invention, in which.

DETAILED DESCRIPTION OF THE PREFERRED EMBODIMENTS

Figure 1:
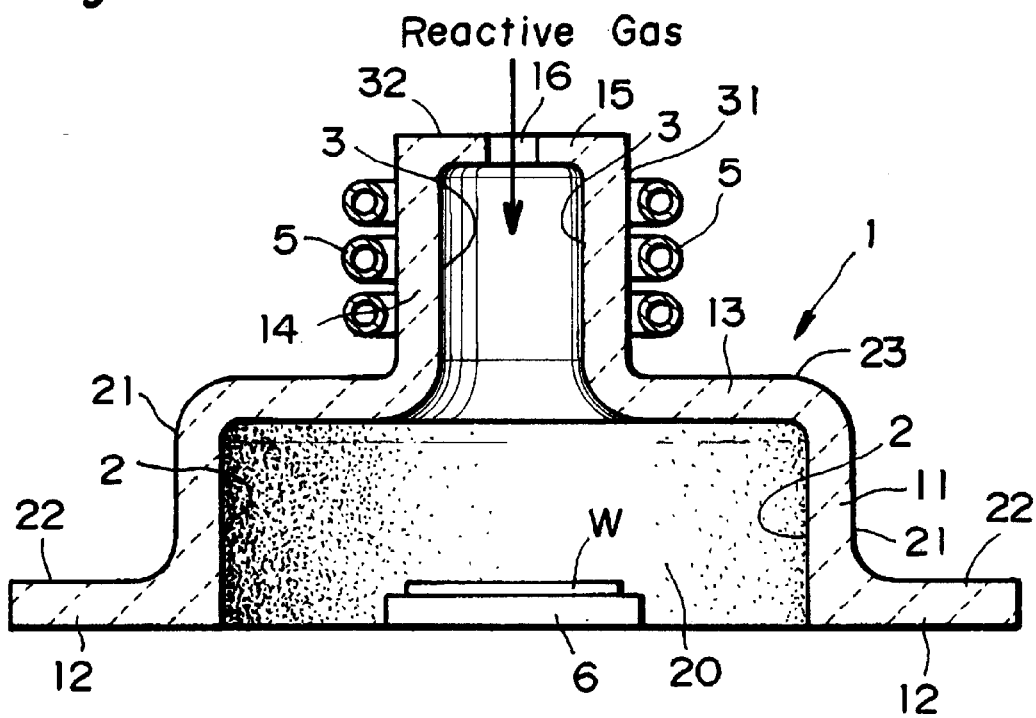
FIG. 1 shows a cross sectional view of a treatment container according to an embodiment of the present invention.

In FIG. 1, a treatment container 1 is of a bell jar type in the shape of a hanging bell useful in application for etching or depositing apparatuses. In this embodiment, the treatment container 1 includes a cylindrical body 11, a flange portion 12 which is integrally connected to the lower section of the cylindrical body 11 and an introduction tube 14 extended upward from the shoulder portion 13 on the upper side of the cylindrical body 11. The flange portion 12 may be supported on an apparatus base (not shown) by joining hermetically therewith. The upper side of the main body 11 is integrally connected to the introduction tube 14.

When in use of the apparatus, the treatment container 1 is mounted on the apparatus base, an induction coil 5 is disposed outside the introduction tube 14, and a pipe (no shown) for gas supply is connected to the upper end 15 of the introduction tube 14 to let the gas in through an inlet 16.

Such a treatment container 1 in this embodiment can be arranged to cover the upper side of an apparatus (not shown), and, as shown in FIG. 1, a support member 6 (or a mount stage) for supporting a workpiece W thereon may be disposed in the interior space 20 of the treatment container 1 where the workpiece W is mounted on the support member 6. A radio frequency power is supplied for the induction coil 5 which forms a high frequency magneto-electric field, in the introduction tube 14, by which a reactant gas supplied through the introduction tube 14 is excited and transformed to plasma. Thus, the generated plasma of the reactant gas is introduced within the cylindrical body 11 of the treatment container 1 for treating the surface of the workpiece W.

In the case of the container used for various vacuum deposition systems, a semiconductor wafer may be used as a workpiece W to make thin films on the wafer with a halogen containing gas induced into the apparatus. In various etching systems, the treatment container may be used for etching a semiconductor wafer as the workpiece W with a corrosive halogen-containing gas induced.

In the embodiment of the invention, the treatment container 1 may be made of a sintered body mainly containing a compound of yttria and alumina. The treatment container is provided with a roughened surface portion 2 thereof. The roughened surface portion 2 may be formed in a portion exposed to a corrosive gas as reactant gas or its plasma, and a mean roughness Ra thereof may preferably be set to be within the range of 1.5 to 10 $\mu$m. In this embodiment, the roughened surface portion 2 are prepared on the inner surfaces of the cylindrical body 11 and the shoulder portion 13.

The surface roughness in the roughened surface portion 2 can increase a specific surface area of said portion compared with a smooth surface, which prevents reaction products, produced through reaction of a ceramic constituting the treatment container 1 with oxygen contained in a gas mixture of the halogen-containing gas, from exfoliating and from falling down as particles from the surface thereof. As a result, a period of time taken for the particles to exfoliate and fall down can effectively be extended.

If the mean roughness Ra of the above roughened surface portion 2 exceeds 10 $\mu$m, large damage is exerted on the sintered body, resulting in generation of particles of the sintered body itself. The mean roughness Ra less than 1.5 $\mu$m facilitates falling of reaction products apart from the surface.

Further, the inner surface 3 of the introduction tube 14 in the treatment container 1 may preferably be smooth. In particular, the mean roughness Ra inside the introduction tub may preferably be set to 1.5 $\mu$m or less for the following reason. The induction coil 4 is disposed close to the introduction tube so that plasma energy density is very high in the inner portion of the tube 14. Accordingly, if severe ruggedness is present on the inner surface 3, plasma energy is concentrated upon protruding portions on the surface or edges, which facilitates corrosion. As a result, remarkable corrosive wear is caused. In addition, since the inner surface 3 located direct under the coil 5 is sputtered, there is an advantage that smoothed surface is less susceptible to sputtering.

Except for the inner surface 3 of the introduction tube 14, the roughened surface portion 2 accepts attachment and formation of the reaction products in the process of etching the workpiece W; accordingly, the asperities thereon are increased to implement an wedge effect (anchoring effect) of the products into the roughened surface, which improves the adhesive strength of the attached products.

The container may be made up of a sintered body mainly composed of a compound of yttria and alumina. In order to further improve thermal shock resistance of the sintered body, it is preferable to add tetragonal zirconia of 0.05 to 5.0% by weight to a yttria-alumina compound. The zirconia takes the form of a phase dispersed in the sintered body. Addition of tetragonal zirconia can improve the thermal shock resistance without damaging a corrosion resistance of the sintered body. This contributes to further expansion of the application range of the container to the members used in manufacturing devices for semiconductor apparatuses and liquid crystal apparatuses.

The yttria-alumina compound with the zirconia content of 0.05% by weight or more improves thermal shock resistance. This is because dispersion of zirconia in the sintered body of the yttria-alumina compound prevents growth of cracks generated by thermal shock.

More particularly, the growth energy of cracks generated by thermal shock is adsorbed by phase transformation of tetragonal zirconia crystals to monoclinic one. A ceria is preferably used as a stabilizing agent to stabilize the zirconia particles as a tetragon contained the yttria-alumina ceramic. As a supplementary agent for stabilizing zirconia, yttria and calcia are available. According to examination of the effect as a supplementary agent, yttria has no effect of stabilizing zirconia because it is used in the sintered body of the present invention to be composed with alumina, whereas calcia is not sufficient in corrosion resistivity. It is proved, therefore, that ceria is most effective as a supplementary agent.

The amount of zirconia added to the sintered body made of a yttria-alumina compound may preferably be 5.0% by weight or less. Addition of zirconia in excess of this amount generally causes poor corrosion resistivity of zirconia, which makes the sintered body susceptible to corrosion by corrosive halide gas or plasma thereof. Stabilization of a zirconia content is achieved by adding 1 weight unit or more ceria against 100 weight units zirconia. Addition of ceria is also effective for preventing heat deterioration of zirconia heated to the temperature of 100 to 200° C. by lamp heating.

In the embodiment of the present invention, it is preferable that the yttria-alumina compound composing the treatment container 1 may be mainly made up of a yttrium-aluminum-garnet compound (hereinafter just referred to as YAG). In the sintered body for the container, an alumina phase or an yttria phase may be contained together with YAG phase.

The yttria-alumina compound composing a crystal phase of the sintered body reacts with a halogen to form various compounds. For example, yttria, if reacting with fluorine gases, mostly forms $YF_3$ and $AlF_3$. If reacting with chlorine gases, yttria forms $YCl_3$ and $AlCl_3$. However, the melting point of halogen compounds obtained from yttria ($YF_3$: 1152° C., $YCl_3$: 680° C.) is higher than the fusion point of conventional halogen compounds ($SiF_4$: −90° C., $SiCl_4$: −70° C., $AlF_3$: 1040° C., $AlCl_3$: 178° C.) generated through reaction with silica glass, an alumina sintered body, or an aluminum nitride sintered body. Consequently, when exposed to corrosive halide gas plasma at high temperature, the yttria-alumina compound provides high and stable corrosion resistance.

However, yttria, if used alone, is in an extremely low degree of sintering and has large porosity of 2% or more, making it difficult to obtain any highly densified body. This causes remarkable decrease of corrosion resistance to corrosive halide gas plasma. On the other hand, alumina reacts with halogen plasma, and therefore alumina combined with yttria can restrain generation of a halide from an alumina content. Accordingly, selecting the yttria-alumina compound as a main content enables to increase the fusion point of a halide formed through reaction with corrosive halide gas and plasma. Particularly preferable grain size thereof is 10 μm or less, since the yttria-alumina compound of this size can improve compactness of a sintered body, and decrease the porosity to 0.2% or less. As a result, resistivity of the ceramic material to halogen plasma is improved.

The compositional proportion of yttria and alumina is $0.365 \leq A \leq 0.385$, and $0.615 \leq B \leq 0.635$, where A represents a mole fraction of yttria whereas B represents a mole fraction of alumina. In this compositional proportion, a single YAG phase is substantially generated. By varying the proportion, a mixed phase of YAG with alumina, or YAG with yttria can be obtained.

In the manufacturing method of such a treatment container of the present invention, the inner surface of the treatment container 1 is processed to have a desired surface roughness by employing several methods. The methods include surface roughening by blasting the surface. There is another method for pressing molded bodies in the application of a rubber pressing technique to transfer a roughened surface configuration with a pressing core to a desirable surface of the molded body.

Figure 2:
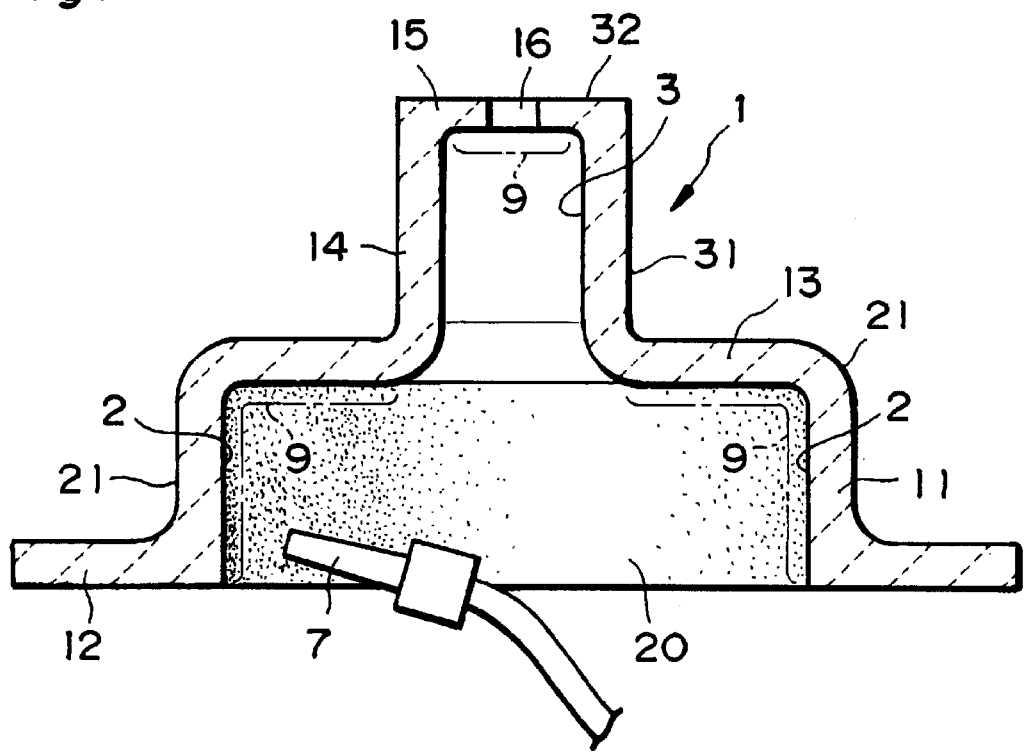
FIG. 2 shows a cross sectional view of the treatment container, showing a blast nozzle used in the method for roughening an inner surface of the treatment container.

As shown in FIG. 2, inner surfaces of the treatment container 1 are roughened by fronting a blast nozzle 7 to the inner surface of the sintered treatment container 1 and blowing abrasive grains upon the inner surface thereof. As blast abrasive grains, powder of hard abrasive materials such as silicon carbide, alumina, and diamond is used. The size of the abrasive grains is selected corresponding to the surface roughness of the treatment container 1. The blast nozzle 7 is directed by a 5-axis positioning controller, for example, so as to be swept as a roughening area 9 to inner surfaces of the cylindrical body 11 and shoulder portion 13 and upper end 15 of the introduction tube 14, inside the treatment container 1, while keeping a constant distance between the inner surface to be roughened in the area 9 and the tip of the blast nozzle 7.

The blasting operation permits use of, for example, SiC abrasive of grain size No. 36 (grain size about 500 μm), specified in JIS R6001. Air pressure of the nozzle is so set as to provide a constant blowing velocity of the abrasive grains. For example, air pressure of approximate 70 psi is available. Portions that do not require to be roughened can be protected from abrasive grains through masking with use of tapes and the like.

Figure 4A:
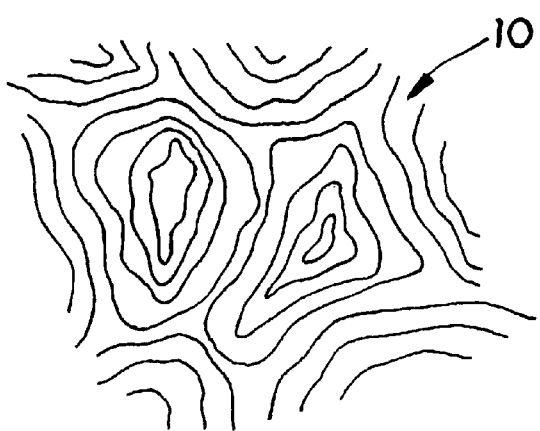
FIG. 4A is a schematic contour line pattern of a surface showing the roughness of a roughened surface portion inside the treatment container of an embodiment according to the present invention.
Figure 4B:
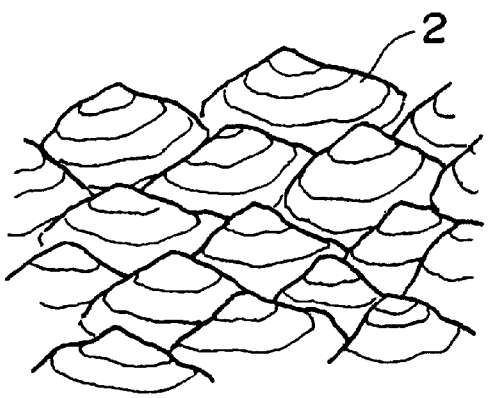
FIG. 4B is a schematic perspective view showing the surface roughness of a roughened surface portion of the treatment container of an embodiment according to the present invention.

In blasting, blowing conditions and blowing time of hard particles are appropriately set in order to generate small waves (undulation) on the surface of the container. The waves enable increase of a surface area and thereby implement increase of the attached amount of reaction products. As schematically shown with coaxial contour lines in FIGS. 4A and 4B, the asperities are preferably made up of innumerable independent conical projections expanded along the surface of the roughened surface portion 2.

Generally, reaction products attached on the surface have a linear expansion coefficient different from that of the wall material of YAG so that the attached products exfoliates after being deposited much. However, the innumerable independent projections stated above present on the surface can fix the attached products on the surface and prevent displacement thereof.

On contrary to this, the asperities made up of innumerable paralleled contour lines on the surface has an effect of preventing the attached products from moving in a vertical direction to the parallel contour lines. However, it has little effect of preventing displacement of the attached products in horizontal direction against the contour lines, and therefore, the undulation of parallel contour lines cannot preventing the attached products from peeling from the surface.

Figure 3:
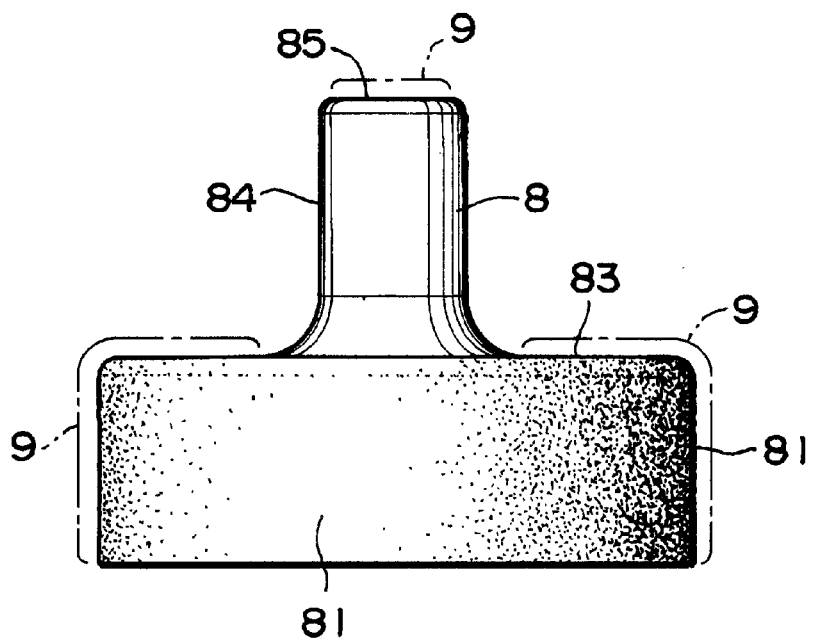
FIG. 3 shows a side view of a core to be used in rubber pressing for shaping a roughened surface portion on an inner surface of the treatment container, which is applied to a manufacturing method of the present invention.

Another method is rubber pressing in which powder of ceramic materials is filled into a space between a rubber tube (not shown) and a core 8 shown in FIG. 3 inserted in the tube, and is compressed under static pressure to form a molded body. In this method, the core 9 has a configuration of an inner surface of the container, and a roughened surface portion 9 is preparatorily formed in a desired position, on the outer surface of a base block 81 for shaping the interior of the treatment container, and a top surface of the end portion 85 of a rod 84 for shaping the inside of the introduction tube 14 of the treatment tube 1. In the process of rubber pressing, the surface roughness on the roughened surface portion of the core 8 is transferred to the inner surface of the molded body formed with use of the core 8. As a result, there is manufactured a molded body for the container having a desired roughened surface portion 2 on the inner surface thereof. In this method, the surface roughness and the configuration of the core 8 is so set as to control the surface roughness and the configuration of the container.

The roughened surface portion 2 has a configuration consisting of independent multiple projections, and roughness thereof is preferably set within the roughness range stated above. The molded body is then sintered, by which a sintered body for the container having a roughened surface portion on the inner surface thereof is provided.

It is preferable to form a resin film for reinforcement on the outside of the treatment container 1. The resin film serves as a buffering material against impact given to the treatment container, thereby decreasing breakage of the treatment container. In this embodiment, a yttria-alumina compound is available as a YAG. Compared to conventional aluminum ceramics, however, the compound is low in mechanical strength including flexural strength and fracture toughness $K_{IC}$ as well as in heat shock resistivity. Consequently, handling in the process of assembling the treatment container into the apparatus or in the process of cleaning after operation may generate cracks or breakage of the container. The resin film 11 has an effect of preventing breakage of the treatment container in the case where the container crashes against metal parts of the apparatus in the process of assembling or crashes against a cleaning vessel in the process of cleaning.

Figure 5:
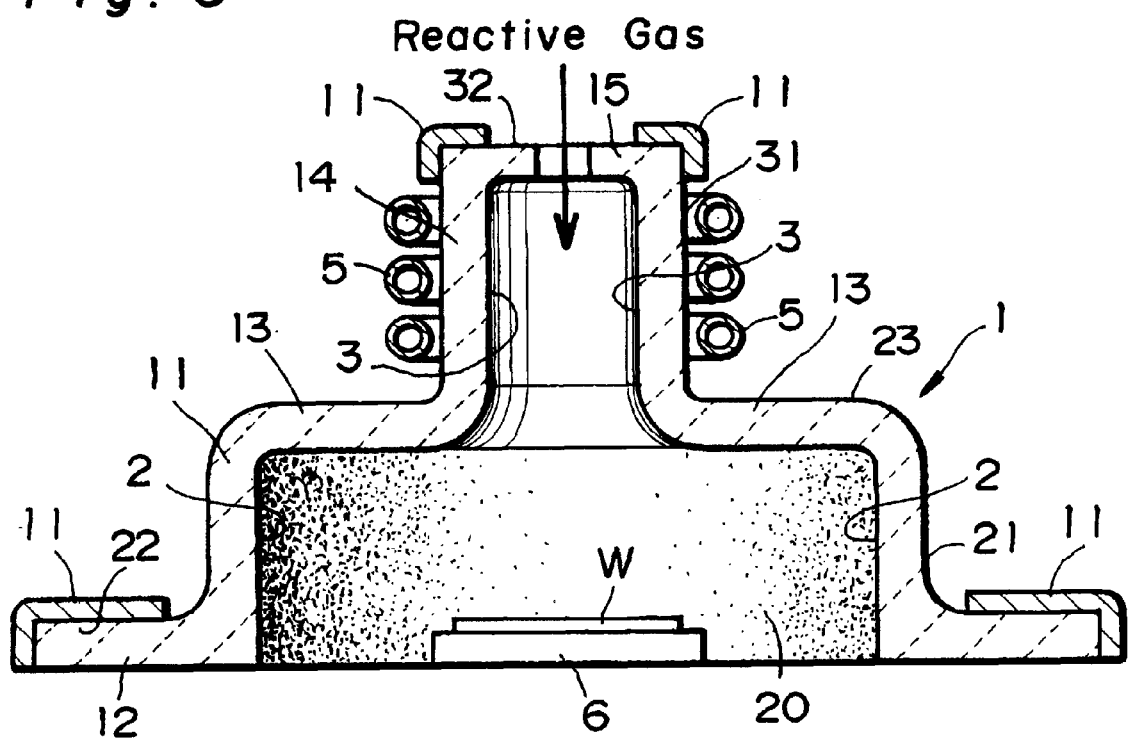
FIG. 5 is a cross sectional view of the treatment container according to another embodiment of the present invention.
Figure 6:
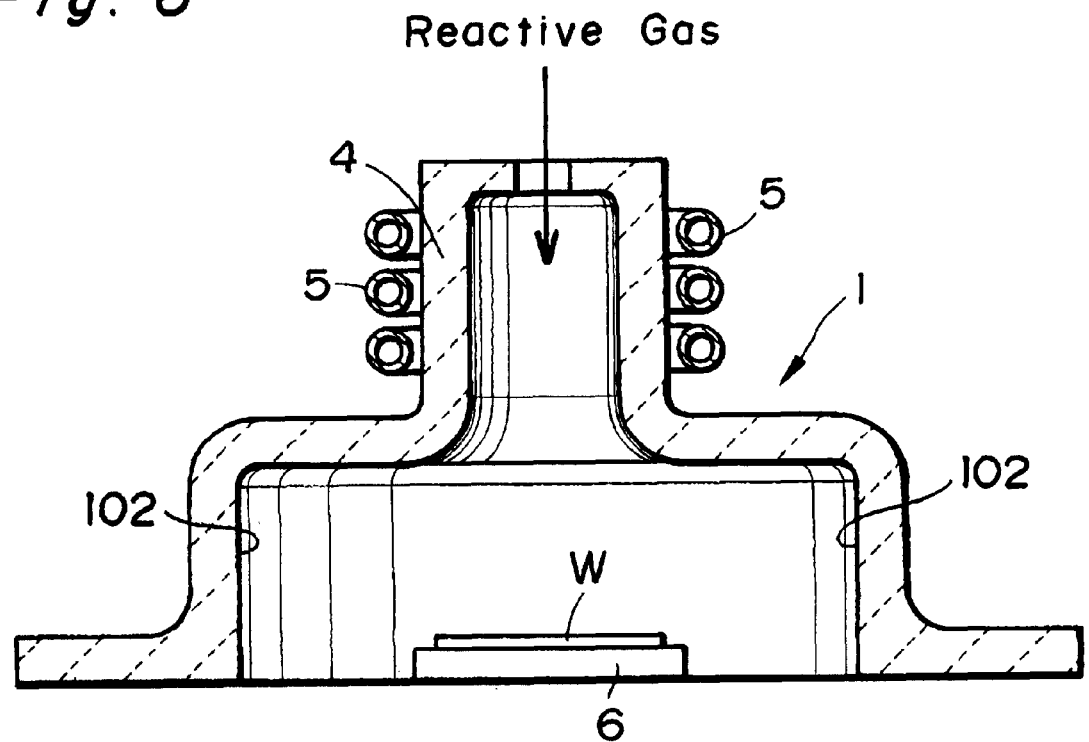
FIG. 6 is a treatment container according to the prior art.

As shown in FIG. 5, such a resin film 11 may preferably be applied to outer portions of the treatment container, which have sensibility to generation of cracks in handling, such as a corner portion where stress tends to concentrate, and an outermost peripheral portion which tends to come into frequent contact with other parts. In the example of FIG. 5, the resin films 11 are applied to an upper surface 22 of the flange 12 and a corner portion between the top end 15 and the outer surface 31 of the introduction tube 14. Use of the resin film can limit the cracking rate of treatment containers during handling to a lower level of about 5% compared to no use of it.

In addition, a material of the resin film 11 is selected from resin with corrosion resistance, especial from polymer materials having resistance to a cleaning agent used in cleaning the container. The treatment container 1 requires periodic removal (cleaning) of a contaminant film, which is attached to the inside of the treatment container 1 during operation. In cleaning, the resin film 11 is exposed to a chemical liquid with strong corrosivity, so that the resin film 11 requires corrosion resistance. As a material of the resin film 11, fluororesin is suitable. The examples of fluororesin include polytetrafluoroethylene (PTFE), tetrafluoroethylene-perfluoroalkoxyethylene copolymer (PFA), and tetrafluoroethylene-hexafluoropropylene copolymer (FEP).

To form the fluororesin film 11, liquid resin is applied to a desired portion of the treatment container 1 through air spraying, electrostatic powder spraying, or fluidized-bed coating, and thereafter baked with an oven. The film thickness is regulated by repeating the above procedure.

Typically, prior to application of liquid resin, the treatment container 1 is preferably dipped in a solvent or baked for removing an oil content, and thereafter film adhesiveness is improved through blasting followed by surface treatment with use of hydrofluoric acid.

The resin film is preferably in the range of 0.2 to 2.0 mm in thickness. With the thickness of less than 0.2 mm, the incident rate of cracks exceeds 60%, which decreases film creation efficiency. With the film thickness in excess of 2 mm, the incident rate of cracks stays as low as about 5%, though the cost for increasing the film thickness increases.

Embodiment 1

The treatment container 1 was manufactured in the following procedure. Alumina powder and yttria powder were added to a YAG composition to provide mixed powder. The mixed powder was then kneaded with a specified binder and water and presintered. The presinter was crushed and kneaded again, and compacted into the shape of a treatment container as shown in FIG. 1 by pressing. The resulting molded body was debinded by heating, and then sintered for 2 hours at 1700° C. to obtain a sintered body. In this embodiment, the sintered body was subjected to blasting with use of abrasive grains. The abrasive grains were so conditioned as to obtain the abrasive grain No. 36, and the surface roughness Ra of the inner wall surface was set to the levels of 1.5 $\mu$m, 5 $\mu$m, 10 $\mu$m and 15 $\mu$m.

In a comparative embodiment, the sintered body was not subjected to blasting, and as-sintered surface thereof was maintained. The roughness thereof was about 1 $\mu$m.

The treatment container 1 of this embodiment and the treatment container 11 of the comparative embodiment were assembled into a RIE type etching apparatus, to conduct tests for determining wear conditions of the treatment containers after a 6-inch sized silicon wafer was etched for 160 hours (8 hours a day for 20 days).

In the test, under the pressure of $10^{-4}$ torr in the treatment container, the reactant gas of $SF_3$ was introduced while high-frequency power of 13.56 MHz was supplied to the induction coil to generate plasma for conducting etching on a semiconductor wafer. Evaluation of wear on the treatment containers was made by counting the number of particles detected on the semiconductor wafer.

The particles on Samples were observed on a photograph with a view field of 80 mm×60 mm taken with a canning electron microscope (SEM) at a magnification of 5000. The result of the test is shown in Table 1, where Symbol ○ represents presence of less than 5 particles with a size of 0.5 mm or more, Symbol Δ represents presence of 5 to 9 particles, and Symbol × represents presence of 10 or more particles.

TABLE 1

| No | Surface Roughness Ra (μm) | Number of Particles on Wafer | | |
|---|---|---|---|---|
| | | 1 hr. | 80 hrs. | 160 hrs. |
| 1 | 1.5 | ○ | ○ | Δ |
| 2 | 5 | ○ | ○ | ○ |
| 3 | 10 | ○ | ○ | ○ |
| *4 | 15 | x | x | x |
| *5 | Prior Art | ○ | Δ | x |

*marks: outside the range of the present invention.

The result indicated that Sample 1, that is a prior art treatment container without a roughened inner wall surface, had 5 to 10 or more particles only after 80 hours of treatment, and had 10 or more particles after 160 hours of treatment.

In the case of Sample 5, 10 or more particles were generated only 1 hour after the treatment. These particles were analyzed and identified as YAG particles. It is considered that roughening processing caused cracks on the inner surface and thereby facilitated exfoliation.

On the other hand, the treatment container 1 of Samples 2 to 4 had a roughened surface portion 2 in the inner surface thereof. Consequently, even after 80 hours of treatment, generation of particles could be confined to less than 5. In the case of Samples 3 and 4, generation of particles could be confined to less than 5 after 160 hours of treatment, proving excellent property thereof. As shown above, it is indicated that forming the roughened surface portion 2 on the inner surface of the treatment container decreases wear and maintenance frequency of the treatment container.

Embodiment 2

The sintered body constituting the treatment container of the present invention is composed of a Single YAG phase, a mixed phase of YAG with yttria, and a mixed phase of YAG with alumina. Each sintered body contains zirconia and a ceria of a content shown in Table 1. A comparative embodiment includes silica glass, an alumina sintered body with purity of 99.5% by weight, an alumina sintered body with purity of 99.9% by weight, and a YAG not containing zirconia and a ceria. These sinters were exposed to plasma in environment of fluorine and chlorine corrosive gas to test corrosion resistance thereof.

In this embodiment, Samples were processed to 30 mm in diameter×3 mm in thickness, and then the surfaces thereof were subjected to lapping for mirror finish. The mirror faced test pieces were set on a reactive ion etching (RIE) apparatus, and exposed to plasma in an ambient of $SF_3$ gas and an ambient of $Cl_2$ gas for three hours. Weight of each sample was measured before and after the treatment, and an etching rate per minute was calculated from decreased amount of the weight. Values of the etching rate was expressed based on relative comparison in which the etching rate of an 99.9% alumina sintered body in the comparative embodiment was equal to one unit.

The property and result of each sample are shown in Table 2.

TABLE 2

| No | Composition (mole %) $Al_2O_3$ | $Y_2O_3$ | Main Crystal Phase | Content of Subsidiary Ingredients (ppm) $ZrO_2$ | $CeO_2$ | Etching Rate (A/min) $SF_6$ |
|---|---|---|---|---|---|---|
| *1 | 0 | 100 | $Y_2O_3$ | 5000 | 50 | 1.43 |
| 2 | 20 | 80 | $Y_2O_3$, YAG | 5000 | 50 | 0.04 |
| 3 | 34 | 66 | $Y_2O_3$, YAG | 5000 | 50 | 0.06 |
| 4 | 40 | 50 | $Y_2O_3$, YAG | 5000 | 50 | 0.04 |
| 5 | 50 | 45 | $Y_2O_3$, YAG | 5000 | 50 | 0.06 |
| 6 | 55 | 45 | $Y_2O_3$, YAG | 5000 | 50 | 0.06 |
| 7 | 65 | 35 | YAG | 5000 | 50 | 0.09 |
| 8 | 80 | 20 | $Y_2O_3$, YAG | 5000 | 50 | 0.24 |
| *9 | 65 | 35 | YAG | 100 | 5 | 0.1 |
| 10 | 65 | 35 | YAG | 500 | 5 | 0.11 |
| 11 | 65 | 35 | YAG | 10000 | 100 | 0.13 |
| 12 | 65 | 35 | YAG | 50000 | 500 | 0.18 |
| *13 | 65 | 35 | YAG | 700000 | 700 | 0.45 |
| *14 | 65 | 35 | YAG | 0 | 0 | 0.09 |
| *15 | Alumina (99.5%) | | $Al_2O_3$ | | | 0.52 |
| *16 | Alumina (99.9%) | | $Al_2O_3$ | | | 1 |
| *17 | Silica Glass | | $SiO_2$ | | | 18.26 |

*marks: outside the range of the present invention.

The result proved that Samples 2 to 8 in Table 2 had excellent corrosion resistance to corrosive gases including $Cl_2$ gas and $SF_3$ gas compared to conventional corrosion resistant members. There exists a tendency that a larger content of yttria provides excellent corrosion resistance. However, Sample 1 consisting of yttria alone could not attain compactness and had a porosity as large as 5%, resulting in deteriorated corrosion resistance. Samples 9 to 12 also had excellent corrosion resistance to corrosive gases including $Cl_2$ gas and $SF_3$ gas compared to conventional corrosion resistant members. A content of zirconia, if in excess of 5.0% by weight as shown in Sample 13, degraded corrosion resistance to the same level as alumina of Sample 15 whose corrosion resistance to $SF_6$ gas was low.

Embodiment 3

Exfoliation from YAG sinters with different surface configurations was compared. As test pieces, there were used a treatment container 1 with a roughened surface portion 2 manufactured through blasting and rubber pressing of the present invention with use of a core 8, a treatment container 1 processed through use of a diamond tool to have innumerable parallel contour lines on the surface of the roughened surface portion 2, and a conventional unprocessed treatment container 11.

For comparison, an aluminum fluoride attachment having a thickness of 5 μm was applied to the entire inner surface of the above test pieces during the process of autoclaving. A wafer of Φ 6 inches was then put into each test piece as shown in FIG. 1 to conduct 20 times of temperature cycling from a room temperature to 300° C., and the number of particles on the wafer was counted. Here, the surface roughness Ra of each test piece having a processed inner surface 2 was 5 μm, and the surface roughness of each conventional test piece having an unprocessed inner surface 2 was 1 μm.

The result of the comparison is shown in Table 3.

TABLE 3

| No | Surface Roughness of Inner surface | Number of Particles |
|---|---|---|
| 1 | Innumerable Concentric Circles-like Contour Lines Formed through Blasting | 0 |
| 2 | Innumerable Concentric Circles-like Contour Lines Formed through Use of a Core | 0 |
| *3 | Innumerable Parallel Contour Lines Formed through Use of a Diamond Tool | 5 |
| *4 | Conventional Unprocessed Surface | 1 |

*marks outside of the range of the present invention.

The result of the comparison indicated that parallel disposed projections on the surface had an effect of preventing displacement of the attachment in vertical direction against the parallel projections. However, the attachment was likely to be displaced in parallel direction against the projections. Accordingly, exfoliation was generated like conventional unprocessed containers, and therefore particles were detected. On the other hand, on the roughened surface obtained through blasting and rubber pressing, exfoliation of the attachment was not found and so the counting of the number of particles was not conducted.

Embodiment 4

First, YAG ceramic materials were processed to a test piece of 200 mm in diameter and 10 mm in thickness. Then, a fluororesin film 11 with different film thickness was applied to the test pieces and baked. The test pieces were cleaned 10 times with use in sequence of alkaline, acid, warm water, and supersonic waves. After that, the fluororesin film 11 was removed and the number of cracks and chippings of each test piece was checked.

The result of the above check is shown in Table 4.

TABLE 4

| No | Fluorine Resin Film ($\mu$m) | Number of Chippings | Evaluation |
|---|---|---|---|
| *1 | 0 | 25 | x |
| *2 | 100 | 20 | x |
| 3 | 200 | 10 | ○ |
| 4 | 300 | 10 | ○ |
| 5 | 400 | 8 | ○ |
| 6 | 500 | 8 | ○ |
| 7 | 1000 | 4 | ○ |
| 8 | 1500 | 3 | ○ |
| 9 | 2000 | 2 | ○ |
| *10 | 2500 | 2 | Δ |

Table 4 shows the number of cracks and chippings having a minor axis of 3 mm or more, where Symbol ○ represents presence of less than 10 cracks and chippings, and symbol x represents presence of 10 or more cracks.

Table 4 indicated that the number of chippings of Samples 3 to 9 was within the sufficiently small range, proving remarkable protection effect given by the resin film. Sample 2 having the fluororesin film 11 with a thickness of 0.2 mm or less had 20 chippings or more, which was not different from the number of clippings obtained by Sample 1 without a resin film. Sample 10 having the fluororesin film 11 with a thickness of 2 mm or more had as low as 2 chippings, though the number of clippings was not different from that in the case of Sample 9 covered with a 2 mm-thick film. Accordingly, it is proved that no additional effect is achieved by the difference in thickness, and therefore the fluororesin film 11 with a thickness of 2 mm or more is not appropriate as a resin film for the present invention with consideration to extra time and effort necessary for the film creation.

What is claimed is:

1. A treatment container for corrosive-gas and/or plasma etching or depositing comprising: a container having a cylindrical body and an introduction tube extended upward from a shoulder portion on an upper side of the cylindrical body, the container comprising a sintered body including more than about 94% by weight of an yttria-alumina compound and zirconia in an amount of 0.05 to 5.0% by weight, wherein the zirconia takes the form of a phase dispersed in the sintered body, and the zirconia phase contains ceria as a stabilizing agent and an inner surface of the cylindrical body having a portion with a roughened surface having a mean roughness Ra of 1.5 to 10 $\mu$m, wherein an inner surface of the introduction tube is a smooth surface having a mean roughness Ra of less than 1.5 $\mu$m.

2. The container according to claim 1, wherein a main crystal phase in the sintered body contains yttrium-aluminum-garnet, alone or with combination to alumina or yttria.

3. The container according to claim 1, wherein the corrosive gas is a substance containing halogen.

4. The container according to claim 1, wherein a resin film is applied on a portion of an outer surface of the treatment container.

5. The container according to claim 4, wherein the resin film is a fluoro-resin film having a thickness of 0.2 to 2.0 mm.

6. A treatment container for corrosive-gas and/or plasma etching or depositing comprising: a container having a cylindrical body and an introduction tube extended upward from a shoulder portion on an upper side of the cylindrical body, the container comprising a sintered body including more than about 95% by weight of an yttria-alumina compound and zirconia in an amount of 0.05 to 5.0% by weight, wherein the zirconia takes the form of a phase dispersed in the sintered body, and the zirconia phase contains ceria as a stabilizing agent and an inner surface of the cylindrical body having a portion with a roughened surface having a mean roughness Ra of 5 to 10 $\mu$m, wherein an inner surface of the introduction tube is a smooth surface having a mean roughness Ra of less than 1.5 $\mu$m.

7. The container according to claim 6, wherein a main crystal phase in the sintered body contains yttrium-aluminum-garnet, alone or with combination to alumina or yttria.

8. The container according to claim 6, wherein the corrosive gas is a substance containing halogen.

9. The container according to claim 6, wherein a resin film is applied on the outer surface of the treatment container.

10. The container according to claim 9, wherein the resin film is a fluoro-resin film having a thickness of 0.2 to 2.0 mm.

* * * * *